(12) United States Patent
Matsumoto et al.

(10) Patent No.: US 11,099,082 B2
(45) Date of Patent: Aug. 24, 2021

(54) SENSOR SUBSTRATE AND DETECTION MODULE

(71) Applicant: KYOCERA Corporation, Kyoto (JP)

(72) Inventors: Hiroshi Matsumoto, Kyoto (JP); Takahito Hirata, Kyoto (JP); Tsutomu Sugawara, Kyoto (JP); Hiroshige Itou, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 377 days.

(21) Appl. No.: 15/754,718

(22) PCT Filed: Oct. 26, 2016

(86) PCT No.: PCT/JP2016/081741
§ 371 (c)(1),
(2) Date: Feb. 23, 2018

(87) PCT Pub. No.: WO2017/073622
PCT Pub. Date: May 4, 2017

(65) Prior Publication Data
US 2018/0245990 A1    Aug. 30, 2018

(30) Foreign Application Priority Data

Oct. 28, 2015  (JP) .............................. JP2015-211977

(51) Int. Cl.
| | |
|---|---|
| *H05K 3/38* | (2006.01) |
| *H05K 3/10* | (2006.01) |
| *G01K 7/18* | (2006.01) |
| *G01K 7/16* | (2006.01) |
| *G01K 1/14* | (2021.01) |

(52) U.S. Cl.
CPC .................. *G01K 7/18* (2013.01); *G01K 1/14* (2013.01); *G01K 7/16* (2013.01); *H05K 3/10* (2013.01); *H05K 3/38* (2013.01)

(58) Field of Classification Search
CPC .. G01K 7/18; G01K 7/16; G01K 1/14; H05K 3/10; H05K 3/38
See application file for complete search history.

(56) References Cited

U.S. PATENT DOCUMENTS

| | | | | |
|---|---|---|---|---|
| 6,653,926 | B1 * | 11/2003 | Zitzmann | ................. G01K 7/18 338/25 |
| 6,699,605 | B2 * | 3/2004 | Umayahara | ............. B32B 17/06 428/212 |
| 2010/0084163 | A1 * | 4/2010 | Kodani | ............... H01L 21/4846 174/250 |

FOREIGN PATENT DOCUMENTS

| | | |
|---|---|---|
| JP | 11-121214 A | 4/1999 |
| JP | 2010109028 A * | 5/2010 |

* cited by examiner

*Primary Examiner* — Lisa M Caputo
*Assistant Examiner* — Janice M Soto
(74) *Attorney, Agent, or Firm* — Volpe Koenig

(57) ABSTRACT

A sensor substrate includes an insulating substrate including a plurality of inorganic particles formed of an insulator in contact with each other and glass, and a wiring conductor disposed on the insulating substrate. The plurality of inorganic particles and the glass are in contact with the wiring conductor, and the glass is disposed at a position between the plurality of inorganic particles and the wiring conductor, and a contact portion between the plurality of inorganic particles and the wiring conductor is larger than a contact portion between the glass and the wiring conductor in a longitudinal sectional view.

9 Claims, 2 Drawing Sheets

OUTER PERIPHERAL PORTION

SENSOR SUBSTRATE AND DETECTION MODULE

TECHNICAL FIELD

The present invention relates to a sensor substrate and a detection module in which a wiring conductor is disposed on an insulating substrate including a ceramic sintered body.

BACKGROUND ART

As a sensor substrate for measuring a temperature used for exhaust gas sensors and the like, a known sensor substrate utilizes a change in electric resistance of a metal material in accordance with a temperature. For example, a sensor substrate having an insulating substrate including a ceramic sintered body such as an aluminum oxide-based sintered body and a wiring conductor including an electrode disposed on the insulating substrate is used.

Japanese Unexamined Patent Application Publication No. 11-121214

SUMMARY OF INVENTION

Technical Problem

However, in the above-described sensor substrate, there is a possibility of causing the following problem. That is, since a contact portion between glass of the insulating substrate and the wiring conductor disposed on the insulating substrate is large, for example, if the temperature of various exhaust combustion gases was detected and the temperature rises rapidly with thermal shock applied, the wiring conductor infiltrates into the glass. Therefore, the wiring conductor is deformed to form a narrow portion, that is, a portion having a small cross-sectional area, and there is a possibility that a resistance of the wiring conductor is increased.

Solution to Problem

A sensor substrate according to an aspect of the present invention includes an insulating substrate including a plurality of inorganic particles formed of an insulator in contact with each other, and glass, and a wiring conductor disposed on the insulating substrate, in which the plurality of inorganic particles and the glass are in contact with the wiring conductor, and the glass is disposed at a position between the plurality of inorganic particles and the wiring conductor, and a contact portion between the plurality of inorganic particles and the wiring conductor is larger than a contact portion between the glass and the wiring conductor in a longitudinal sectional view.

A detection module according to another aspect of the present invention includes the sensor substrate according to the above configuration, and a module substrate to which the sensor substrate is connected.

Advantageous Effects of Invention

The sensor substrate according to an aspect of the present invention includes the insulating substrate including the plurality of inorganic particles formed of the insulator in contact with each other and glass, and the wiring conductor disposed on the insulating substrate, in which the plurality of inorganic particles and the glass are in contact with the wiring conductor, and the glass is disposed at the position between the plurality of inorganic particles and the wiring conductor, and the contact portion between the plurality of inorganic particles and the wiring conductor is larger than the contact portion between the glass and the wiring conductor in the longitudinal sectional view. Therefore, the contact portion between the glass and the wiring conductor is small, and, for example, if the temperature of various combustion exhaust gases is detected and thermal shock is applied, it is difficult for the wiring conductor to infiltrate into the glass, the wiring conductor is less likely to be deformed, a portion where the cross-sectional area changes is less likely to be formed, and therefore a change in the resistance of the wiring conductor can be suppressed.

The detection module according to another aspect of the present invention includes the sensor substrate according to the above configuration, and therefore accuracy of detecting the temperature change can be increased.

DESCRIPTION OF EMBODIMENTS

A sensor substrate according to an embodiment of the present invention will be described with reference to the accompanying drawings. Up and down in the following description are determined for convenience and do not limit the up and down when actually using the sensor substrate and the like.

Figure 1:
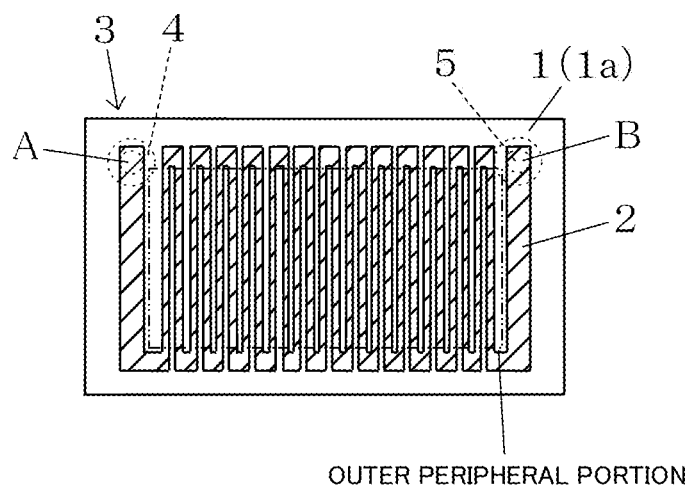
FIG. 1 is a plan perspective view illustrating a sensor substrate of the present invention.
Figure 2:
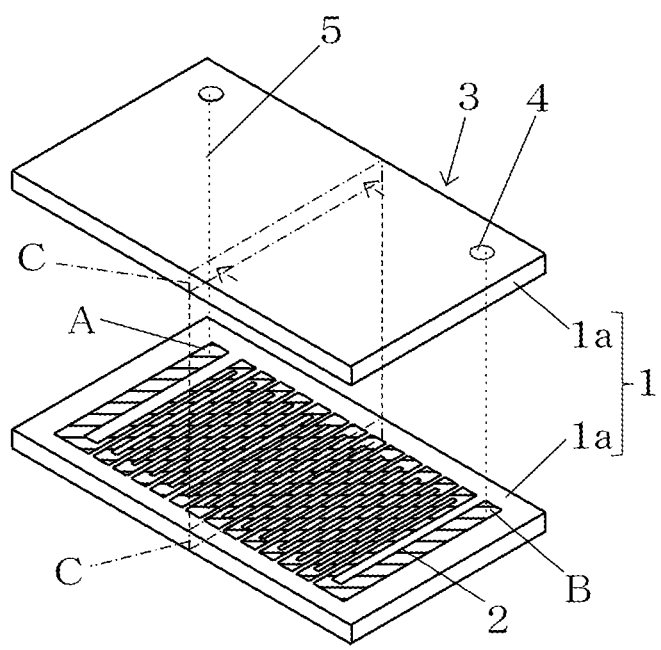
FIG. 2 is an exploded perspective view of the sensor substrate illustrated in FIG. 1.

As illustrated in FIGS. 1 and 2, a sensor substrate 3 is basically formed by disposing a wiring conductor 2 on an insulating substrate 1 formed by laminating a plurality of insulating layers 1a. A terminal 4 is disposed on the sensor substrate 3. In FIG. 1, the wiring conductor 2 is illustrated when the sensor substrate 3 is viewed from an upper side through the upper insulating layer 1a. Temperature measurement is performed utilizing the fact that an electric resistance of the wiring conductor 2 varies in accordance with temperature. That is, the temperature of the environment where the sensor substrate 3 or the like is located is calculated and detected from a measured value of the electric resistance of the wiring conductor 2. The terminal 4 may be formed not only on the upper surface but also on the lower surface of the insulating substrate 1.

The insulating substrate 1 is, for example, a flat plate such as a quadrilateral plate, and is a base portion for disposing the wiring conductor 2 electrically insulated. The insulating substrate 1 includes a ceramic sintered body such as an aluminum oxide-based sintered body, an aluminum nitride-based sintered body, a mullite-based sintered body, a glass ceramic sintered body, a zirconia-based ceramic (zirconium oxide-based sintered body) or the like. The insulating substrate 1 is formed by laminating the plurality of insulating layers 1a (two layers in the example illustrated in FIG. 2) each including such a ceramic sintered body.

For example, if each insulating layer 1a includes the aluminum oxide-based sintered body, the insulating substrate 1 can be manufactured by the following method. First, a raw material powder such as silicon oxide ($SiO_2$), magnesium oxide (MgO), and manganese oxide ($Mn_2O_3$) is added as a sintering aid to a powder of aluminum oxide ($Al_2O_3$) which becomes inorganic particles 1b and 1c, an appropriate binder, an appropriate solvent, and an appropriate plasticizer are added, and a resultant mixture is kneaded to form a slurry. Thereafter, the slurry is formed into a sheet by a well-known doctor blade method, a calender roll method, or the like in the related art to obtain a ceramic green sheet. The ceramic green sheet is subjected to an appropriate punching process, and a plurality of ceramic green sheets is laminated as required, and the resultant ceramic green sheet is fired at a high temperature (approximately 1,300° C. to 1,600° C.) to prepare the insulating substrate 1. Each of the plurality of ceramic green sheets is the insulating layer 1a. The insulating substrate 1 includes a glass 1d.

The wiring conductor 2 includes platinum or a metal material containing platinum as a main component. Platinum is a metal material whose electric resistance varies in accordance with temperature. In order to detect the change in accordance with the temperature in the electric resistance of the metal material in accordance with the temperature change, the larger an absolute value of the electric resistance of the wiring conductor at a reference temperature (for example, a room temperature of approximately 25° C.) is, the more preferable.

This fact is due to the following reason. That is, the change in the electric resistance according to the temperature change of the wiring conductor 2 occurs at a constant ratio regardless of a magnitude (absolute value) of the electric resistance of the reference temperature. That is, as the value of the electric resistance at the reference temperature increases, the absolute value of the change in the electric resistance due to the temperature change increases. The greater the absolute value of the change in the electric resistance, the less susceptible to the influence of noise (variation in electric resistance due to factors other than temperature changes). The measurement is easily performed. Therefore, it is preferable for the wiring conductor 2 to have a high electric resistance at the reference temperature. Therefore, metal materials such as platinum are linear (that is, an effective form to increase the length of a portion where the electric resistance is measured and to increase the absolute value of the electric resistance).

For a component other than platinum in the metal material containing platinum as the main component, the component (type) or addition amount is appropriately selected for the purpose of adjusting the temperature resistance coefficient (TCR) of the wiring conductor 2, improving the heat resistance, and the like. Examples of the component other than platinum include a metal material of a platinum group element such as palladium, rhodium, iridium or the like, and gold. For example, if linearity of the change in electric resistance is desired with respect to the temperature change of the wiring conductor 2, the content of platinum is preferably large.

The metal material containing platinum as the main component contains platinum at a ratio of approximately 80% by mass or more. The platinum and the other components may form an alloy or may exist as independent crystal grains. The wiring conductor 2 may contain an additive other than the metal component such as platinum or the metal material containing platinum as the main component.

Examples of the additive include a particle of an inorganic substance such as aluminum oxide and the like similar to the particle contained in the insulating substrate 1. The additive is added, for example, for matching the firing shrinkage ratio between the wiring conductor 2 and the insulating layer 1a.

The wiring conductor 2 can be formed, for example, by applying a metal paste prepared by kneading platinum powder with an organic solvent and a binder to a main surface of the ceramic green sheet to be the insulating layer 1a in a predetermined pattern and co-firing.

The electric resistance between one end (first end portion A) of the wiring conductor 2 and the other end (second end portion B) opposite thereto is measured by, for example, an external electric circuit. The electric resistance changes in accordance with the temperature of the wiring conductor 2, and the temperature of the wiring conductor 2 varies in accordance with the temperature (external temperature) of the environment where the sensor substrate 3 and the like are located. That is, the external temperature is detected by detecting the electric resistance between the first end portion A and the second end portion B of the wiring conductor 2.

The external temperature is, for example, a temperature of various combustion exhaust gases, and a high temperature of approximately several hundred to 1,000° C. may need to be detected. Since the stability at such a high temperature and the linearity of the electric resistance change in accordance with the temperature are good, the wiring conductor 2 includes the platinum or the metal material containing platinum as the main component. For example, the sensor substrate 3 having the terminal 4 is connected to a module substrate (not illustrated) including an electric circuit (external electric circuit) for detecting resistance as described above to function as a detection module, and such a detection module is mounted on a portion (gas flow passage or the like) where the temperature to be measured exists.

If the wiring conductor 2 is in a state of being exposed to the outside air, there is a possibility that the electric resistance unnecessarily changes due to, for example, adhesion of foreign matter or destruction due to accidental collision with a module substrate or other component mounted on the module substrate. In order to prevent such situation, the wiring conductors 2 may be disposed between the layers of the plurality of insulating layers 1a. In other words, the wiring conductor 2 may be disposed inside the insulating substrate 1 and may not be exposed to the outside.

Figure 3:
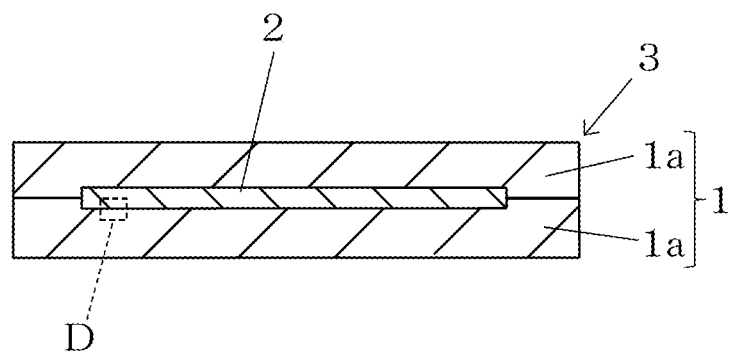
FIG. 3 is a cross-sectional view taken along plane C of FIG. 2.
Figure 4:
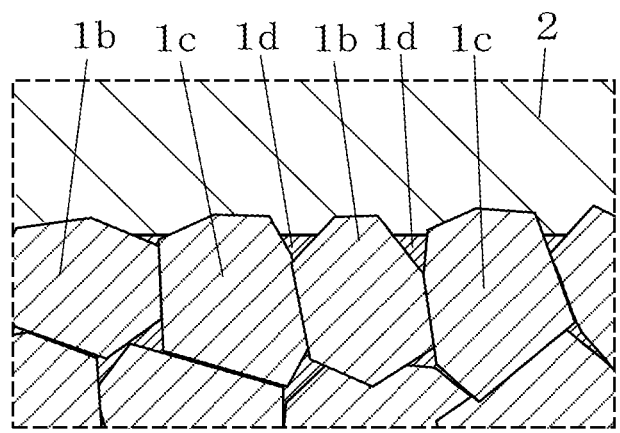
FIG. 4 is an enlarged cross-sectional view of portion D in FIG. 3.

As illustrated in FIGS. 3 and 4, the sensor substrate 3 includes the insulating substrate 1 having a plurality of inorganic particles 1b and 1c and a glass 1d formed of insulators in contact with each other, and the wiring conductor 2 disposed on the insulating substrate 1. The plurality of inorganic particles 1b and 1c and the glass 1d are in contact with the wiring conductor 2. In a longitudinal sectional view, the glass 1d is disposed at a position between the plurality of inorganic particles 1b and 1c and the wiring conductor 2. A contact portion between the plurality of inorganic particles 1b and 1c and the wiring conductor 2 is larger than a contact portion between the glass 1d and the wiring conductor 2. With such a configuration, the contact portion between the glass 1d and the wiring conductor 2 is small. For example, if the temperature of various combustion exhaust gases is detected, and thermal shock is applied, it is difficult for the wiring conductor 2 to infiltrate into the glass 1d, the wiring conductor 2 is less likely to be deformed, a portion where the cross-sectional area changes is less likely to be formed, and therefore a change in the resistance of the wiring conductor 2 can be suppressed.

In the longitudinal sectional view, the configuration in which the contact portion between the plurality of inorganic particles 1b and 1c and the wiring conductor 2 is larger than the contact portion between the glass 1d and the wiring conductor 2 may be obtained, for example, by cutting the sensor substrate 3 at the portion where the wiring conductor 2 is disposed so that the sensor substrate 3 can be viewed in a longitudinal section, photographing the section with a scanning electron microscope (SEM) at a magnification of 1,000 to 3,000 times, and observing the photograph.

In the longitudinal sectional view, if the glass 1d between the plurality of inorganic particles 1b and 1c and the wiring conductor 2 has the size in the thickness direction of the insulating substrate 1 smaller than a half of the particle diameter of the plurality of inorganic particles 1b and 1c, the glass 1d in contact with the wiring conductor 2 is small. For example, if the temperature of various combustion exhaust gases is detected and the thermal shock is applied, it is more difficult for the wiring conductor 2 to infiltrate into the glass 1d, the wiring conductor 2 is less likely to be deformed, a portion where the cross-sectional area changes is less likely to be formed, and therefore an increase in the resistance of the wiring conductor 2 can be suppressed.

For example, measurement of the particle diameter of the inorganic particles 1b and 1c may be obtained by cutting the sensor substrate 3 at the portion where the wiring conductor 2 is disposed so that the sensor substrate 3 can be viewed in a longitudinal section, photographing the section with a scanning electron microscope (SEM) at a magnification of 1,000 to 3,000 times, analyzing the photographed image using an image analyzing device (for example, WinROOF made by Mitani Corporation) to obtain the area of the inorganic particles 1b and 1c, and calculating the diameter (diameter equivalent circle) when the area is a circle having the same area as the area of the inorganic particles 1b and 1c.

It is more effective that the inorganic particles 1b and 1c have a particle diameter of 3 μm to 10 μm. If the particle diameter of the inorganic particles 1b and 1c is 10 μm or less, since a volume of the glass 1d in contact with the wiring conductor 2 is reduced, the bonding strength between the insulating substrate 1 and the wiring conductor 2 is improved and the sensor substrate 3 having good bonding reliability to the wiring conductor 2 can be obtained. If the particle diameter of the inorganic particles 1b and 1c is 10 μm or less, since the movement of the oxide from the wiring conductor 2 is reduced, and as a result, the sensor substrate 3 in which the deformation of the wiring conductor 2 is suppressed can be obtained.

If the inorganic particles 1b and 1c protrude toward the wiring conductor 2 at the contact portion between the plurality of inorganic particles 1b and 1c and the wiring conductor 2, even if a stress due to an external force or a thermal shrinkage difference between the insulating substrate 1 and the wiring conductor 2 is applied to the wiring conductor 2 along the contact portion between the insulating substrate 1 and the wiring conductor 2, the stress is dispersed by the protruding portions of the inorganic particles 1b and 1c and the bonding reliability of the wiring conductor 2 is improved, and therefore the reliability in detection of the sensor substrate 3 can be further improved, which is preferable.

If the thickness of the wiring conductor 2 is larger than the particle diameter of the plurality of inorganic particles 1b and 1c, even if deformation of the wiring conductor 2 may occur, a portion where the cross-sectional area changes is less likely to be formed, and a change in the resistance of the wiring conductor 2 can be suppressed effectively.

If the purity of aluminum oxide in the insulating layer 1a is 90% by mass to 99.9% by mass, even when detecting a high temperature of, for example, approximately several hundred to 1,000° C., since the insulating layer 1a has a smaller content of glass which easily flows at high temperature, the contact portion between the glass 1d and the wiring conductor 2 is smaller. For example, if the temperature of various combustion exhaust gases is detected, and the thermal shock is applied, it is more difficult for the wiring conductor 2 to infiltrate into the glass 1d, the wiring conductor 2 is less likely to be deformed, and a portion where the cross-sectional area changes is less likely to be formed, and therefore a change in the resistance of the wiring conductor 2 can be suppressed.

The terminal 4 disposed on the sensor substrate 3 is a portion for connecting the wiring conductor 2 to the module substrate including the external electric circuit. The terminal 4 can be formed by the same method using, for example, a metal material (platinum or the like) similar to the material of the wiring conductor 2. The terminal 4 of the sensor substrate 3 of the embodiment is a circular pattern including platinum. The terminal 4 may have another shape, or the terminal 4 may be formed by a lead terminal (not illustrated) including gold or the like.

Since the terminal 4 may be placed in a high-temperature environment along with the sensor substrate 3 as described later, it is preferable that the terminal 4 includes a metal material having a high oxidation resistance at high temperature, such as platinum group metal including platinum, or gold.

The terminal 4 for temperature measurement electrically connected to the wiring conductor 2 of the sensor substrate 3 is disposed on the sensor substrate 3 having the above configuration. In the embodiment, the wiring conductor 2 and the terminal 4 are electrically connected by a through-conductor (via conductor) 5 penetrating the insulating layer 1a in the thickness direction.

The through-conductor 5 includes a conductor material (metal material) containing a metal material (platinum or the like) similar to the material of the wiring conductor 2 as the main component, for example. Examples of the metal material include platinum or a material containing platinum as a main component and an inorganic filler such as alumina added thereto. The inorganic filler is added for matching the shrinkage ratio and shrinking behavior of the through-conductor 5 and the insulating substrate 1 when the both are formed by co-firing, for example.

The through-conductor 5 can be formed, for example, by filling a through hole disposed in advance in the ceramic green sheet to be the insulating layer 1a with a metal paste of platinum similar to the metal paste for forming the wiring conductor 2 and co-firing the metal paste. For example, the through hole can be disposed in the ceramic green sheet by a machining method such as a mechanical drilling process using a metal pin, a drilling process with a laser beam, or the like. Particles of the inorganic filler as described above may be added to the metal paste.

According to such a sensor substrate 3, accuracy of detecting the temperature change can be increased.

Temperature detection using such a sensor substrate 3 is performed as follows when a measuring device measures the temperature of exhaust gas from equipment having a combustion unit such as an internal combustion engine (such as gasoline engines and diesel engines), a gas turbine, a boiler, and the like. That is, first, the terminal 4 of the sensor substrate 3 is connected to the module substrate including the circuit for measuring the electric resistance as described above to prepare a detection module. The terminal 4 of the sensor substrate 3 may be electrically connected to the module substrate by solder joining or welding a lead wire (not illustrated) to the terminal 4. Next, the sensor substrate 3 connected to the detection module is mounted on the flow path of the exhaust gas. At least the sensor substrate 3 may be positioned in the exhaust gas, and other portion of the module substrate is not necessarily located in the exhaust gas. Thereafter, the electric resistance of the sensor substrate 3 and the electric resistance between the first end portion A and the second end portion B of the wiring conductor 2 included in the sensor substrate 3 change in accordance with the temperature of the exhaust gas, and the electric resistance value is measured by a circuit for measuring the electric circuit. Based on the measured electric resistance, for example, the temperature of the wiring conductor 2, that is, the temperature of the portion where the sensor substrate 3 including the wiring conductor 2 is located can be detected from the relationship between the electric resistance and temperature measured in advance.

A line width of the wiring conductor 2 is appropriately set in accordance with the conditions such as the accuracy of the temperature measurement for the temperature to be detected, the temperature range, the conditions such as the thickness and the length of the wiring conductor 2, the distance from the outer periphery of the insulating layer 1a to the wiring conductor 2, the productivity, and economic efficiency.

For example, if the temperature range to be detected is a high temperature range of approximately 500° C. to 1,000° C., the wiring conductor 2 includes platinum (pure platinum having a platinum content of 99.99% by mass or more), and the thickness of the wiring conductor 2 is approximately 5 to 15 μm, the line width of the wiring conductor 2 is set to, for example, approximately 50 to 200 μm at a portion along the outer periphery of the insulating layer 1a. The line width of a portion of the wiring conductor 2 other than the portion along the outer periphery of the insulating layer 1a is set to approximately 20 to 50 μm.

Considering such thickness settings and the like of the wiring conductor 2, it is preferable that the insulating layer 1a includes the ceramic sintered body and the wiring conductor 2 is a thick film conductor. The wiring conductor 2 is formed by co-firing with the insulating substrate 1 (a plurality of insulating layers 1a), for example. If the wiring conductor 2 is the thick film conductor, it is easy to allow the thickness relatively thick, such as approximately 10 μm or more as described above. Since such a relatively thick wiring conductor 2 can be formed by co-firing with the insulating substrate 1, it is advantageous in terms of strength of bonding between the wiring conductor 2 and the insulating substrate 1 and the productivity of the sensor substrate 3. The pattern of the wiring conductor 2 can be easily set only by adjusting the printing pattern of the metal paste to be the wiring conductor 2. Therefore, it is advantageous in terms of design freedom, productivity, and the like.

In the example of FIGS. 1 and 2, the wiring conductor 2 has a meandering shape having a plurality of linear portions (without reference numeral) arranged in parallel to each other and a plurality of folded portions (without reference numeral) connecting end portions of adjacent linear portions among the plurality of linear portions. The folded portion connects every other ends of the plurality of adjacent linear portions to each other. In other words, the plurality of linear portions and the plurality of folded portions are sequentially connected in series to form one meandering pattern (zigzag pattern).

If the wiring conductor 2 has the meandering pattern, since the relatively long wiring conductor 2 is sequentially folded and arranged, it is advantageous for disposing as long a wiring conductor 2 as possible on one layer. Since the length of the wiring conductor 2 is longer, the electric resistance between the first end portion A and the second end portions B of the wiring conductor 2 can be increased. That is, for example, since the electric resistance of the wiring conductor 2 at the reference temperature (room temperature) is relatively large, the absolute value of the change in the electric resistance according to the temperature change is larger. Therefore, it is easy to accurately measure temperature from a room temperature to a high temperature range such as approximately 1,000° C. described above.

For example, as in the example of FIGS. 1 and 2, if the insulating layer 1a has a rectangular shape, and the wiring conductor 2 has the meandering shape, if the linear portions and the folded portions among the wiring conductor 2 with the meandering shape are arranged in parallel to the outer periphery of the insulating layer 1a, the following effects can be obtained. That is, the distances from the outer periphery of the insulating layer 1a to the wiring conductor 2 closest to the outer periphery thereof are aligned at substantially the same distance in the linear portions and the folded portions. Therefore, in the linear portions and the folded portions, the possibility that the distance from the outer periphery of the insulating layer 1a to the wiring conductor 2 is partially extremely close and the platinum of the wiring conductor 2 is likely to sublimate to the outside is reduced.

Width of the portions with relatively large line widths of the linear portion and the folded portion may be substantially the same, and distance between the outer periphery of the insulating layer 1a and the linear portion and distance between the outer periphery of the insulating layer 1a and the folded portion may be substantially the same. At substantially the entire circumference of the outer periphery of the insulating layer 1a, the distances from the outer periphery to the wiring conductors 2 are approximately the same. Therefore, the sublimation of platinum to the outside in a portion in the length direction of the wiring conductor 2 can further be reduced.

Such a wiring conductor 2 can be regarded as a quadrangular shape whose overall shape is substantially similar (smaller shape) to a shape of an interlayer between the quadrilateral insulating layers 1a. That is, with respect to the outer periphery of the quadrangular insulating layer 1a, the entire outer periphery of the rectangular wiring conductor 2 is arranged in parallel, and the line width at the outer peripheral portion of the entire rectangular wiring conductor 2 is larger than the line width at the other portion (central portion).

Therefore, it is preferable that the sensor substrate 3 has the meandering shape and the linear portion and the folded portion are arranged in parallel to the outer periphery of the insulating layer 1a when the accuracy of temperature measurement, long-term reliability, and the like of the wiring conductor 2 are desired. If the insulating layer 1a (insulating substrate 1) has a rectangular shape, for example, if the sensor substrate 3 is prepared in the form of a multi-piece substrate in which a plurality of regions to be such insulating substrates is arranged and formed on one mother substrate, arrangement thereof is easily performed. That is, it is more advantageous in terms of productivity and economic efficiency as the sensor substrate 3.

In the example of FIGS. 1 and 2, in the interlayer between the rectangular insulating layers 1a, the linear portion of the meandering wiring conductor 2 is arranged along a short side direction, and the folded portion is arranged along a long side direction. That is, the length of the linear portion is relatively short and the number of folded portions is relatively large. The length of one portion of the wiring conductor 2 which is linearly continued is relatively short. The length of the outer peripheral portion of the wiring conductor 2 close to the outer periphery of the insulating layer 1a is relatively short. Therefore, for example, the thermal stress due to the difference in thermal expansion coefficient between the insulating layer 1a and the wiring conductor 2 is likely to be reduced, and it is advantageous for reducing the possibility of mechanical breakdown of the insulating layer 1a and the wiring conductor 2 due to thermal stress.

Figure 5:
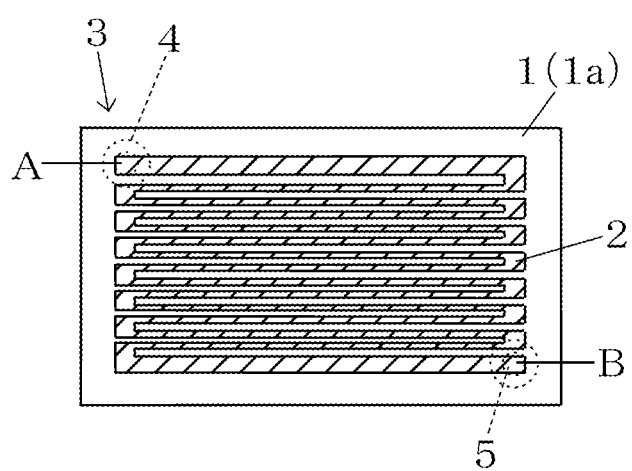
FIG. 5 is a plan perspective view illustrating another modified example of the sensor substrate illustrated in FIG. 1.

FIG. 5 is a plan perspective view illustrating a modified example of the sensor substrate 3 illustrated in FIGS. 1 and 2. In FIG. 5, portions similar to those in FIGS. 1 and 2 are given the same reference numerals. In the example of FIG. 5, the shape of the insulating substrate 1 is a quadrangular (rectangular) plate similar to the example in FIGS. 1 and 2, and the pattern of the wiring conductor 2 is different from the example in FIGS. 1 and 2. In the example of FIG. 5, configurations other than the pattern of the wiring conductor 2 are basically the same as those of the example in FIGS. 1 and 2. Descriptions of those similar to the above embodiment are omitted.

In the example of FIG. 5, the wiring conductor 2 of the meandering pattern is arranged such that the linear portion is along the long side direction of the rectangular insulating layer 1a (interlayer). The folded portion is arranged along the short side direction. If the metal paste to be the wiring conductor 2 is applied by a method such as screen printing, the following advantageous effects are obtained. That is, in the printing method, bleeding is likely to occur in the metal paste at the folded portion (boundary portion between folded portion and linear portion). Therefore, reducing the number of folding portions reduces bleeding and increases the resistance value of the entire wiring conductor 2. In the form illustrated in FIG. 5, since the number of the folding portions is less than that in the example in FIG. 1, it is easier to increase the total resistance value.

The sensor substrate 3 of the present invention is not limited to the example of the above embodiment, and various modifications are possible within the scope of the gist of the present invention. For example, wiring conductors (not illustrated) may be arranged between four or more layers, and the line widths of these wiring conductors may be larger as the wiring conductors are arranged between layers closer to the upper surface or closer to the lower surface (main surface closer to wiring conductor) of the insulating substrate 1. The wiring conductor 2 of the sensor substrate 3 is not limited to the conductor of the meandering shape, and other patterns may be used.

The invention claimed is:

1. A sensor substrate comprising:
    an insulating substrate comprising a plurality of insulating layers laminated to one another, each of the plurality of insulating layers including a plurality of inorganic particles formed of an insulator in contact with each other, and glass; and
    a wiring conductor having a meandering shape and being disposed between two adjacent insulating layers of the plurality of insulating layers, wherein the plurality of inorganic particles and the glass are in contact with the wiring conductor,
    the glass is disposed at a position between the plurality of inorganic particles and the wiring conductor, and a contact portion between the plurality of inorganic particles and the wiring conductor is larger than a contact portion between the glass and the wiring conductor in a longitudinal sectional view, and
    the plurality of inorganic particles protrude toward the wiring conductor which is contacted with the glass at the contact portion between the plurality of inorganic particles and the wiring conductor.

2. The sensor substrate according to claim 1, wherein a size of the glass between the plurality of inorganic particles and the wiring conductor in a thickness direction of the insulating substrate is smaller than a half of a particle diameter of the plurality of inorganic particles in the longitudinal sectional view.

3. The sensor substrate according to claim 2, wherein a thickness of the wiring conductor is larger than a particle diameter of the plurality of inorganic particles.

4. The sensor substrate according to claim 3, further comprising:
    a terminal connected to the wiring conductor.

5. The sensor substrate according to claim 2, further comprising:
    a terminal connected to the wiring conductor.

6. The sensor substrate according to claim 1, wherein a thickness of the wiring conductor is larger than a particle diameter of the plurality of inorganic particles.

7. The sensor substrate according to claim 6, further comprising:
    a terminal connected to the wiring conductor.

8. The sensor substrate according to claim 1, further comprising:
    a terminal connected to the wiring conductor.

9. A detection module comprising:
    the sensor substrate according to claim 1.

* * * * *